(12) United States Patent
Lindsay, Jr. et al.

(10) Patent No.: US 6,248,424 B1
(45) Date of Patent: *Jun. 19, 2001

(54) METHOD AND APPARATUS FOR INDICATING DEGREE OF MANUFACTURE OF AN ARTICLE

(75) Inventors: Ernest H. Lindsay, Jr., Manhattan; Jon M. Patterson, Mokena, both of IL (US)

(73) Assignee: Illinois Tool Works Inc., Glenview, IL (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/819,589

(22) Filed: Mar. 17, 1997

(51) Int. Cl.$^7$ ........................................... B32B 3/02
(52) U.S. Cl. .......................... 428/192; 428/131; 428/119; 428/195; 428/901; 40/299.01; 438/15; 438/112; 438/123; 438/124; 438/127; 438/800; 174/52.2; 29/593; 29/841; 29/855; 257/730; 257/666; 257/678; 257/787; 257/798; 264/271.1; 264/272.11; 264/272.15; 264/272.17; 264/278
(58) Field of Search ........................................ 428/131, 119, 428/192, 195, 901; 40/299.01; 438/15, 112, 123, 124, 127, 800; 174/52.2; 29/593, 841, 855; 257/730, 666, 678, 787, 798; 264/271.1, 272.11, 272.15, 272.17, 278

(56) References Cited

U.S. PATENT DOCUMENTS

| | | | |
|---|---|---|---|
| 762,172 | 6/1904 | Kersten | 24/128 |
| 841,321 | 1/1907 | Howard | 40/621 |
| 1,562,882 | 11/1925 | Hagner | 40/299.01 |
| 1,647,140 | 11/1927 | Ludy | 24/601.7 |
| 2,198,162 | 4/1940 | Greenwald | 116/216 |
| 2,214,011 | 9/1940 | Broudy | 229/74 |
| 3,067,534 | 12/1962 | Paxton | 40/666 |
| 3,227,268 | 1/1966 | Gringer | 206/349 |
| 3,395,470 | 8/1968 | Voice | 40/665 |
| 3,810,300 | * 5/1974 | Hulmes et al. | 29/574 |
| 4,900,637 | 2/1990 | Darovec | 428/577 |
| 4,985,988 | * 1/1991 | Littlebury | 29/827 |
| 5,344,795 | * 9/1994 | Hashemi et al. | 437/214 |
| 5,503,895 | * 4/1996 | Ziberna | 428/131 |

* cited by examiner

*Primary Examiner*—William P. Watkins, III
(74) *Attorney, Agent, or Firm*—Schwartz & Weinrieb

(57) ABSTRACT

A novel method and apparatus for indicating a degree of manufacture of an insert molded component useable in an end use assembly by forming a removable appendage protruding from the insert molded component, or article, manufactured to an intermediate degree, the insert molded component having a lead frame at least partially embedded in a molded housing member, and the removable appendage coupled to at least one or both of the lead frame and the molded housing member, the lead frame having at least two electrical conductors coupled separably by a tie member, the removable appendage removable upon or after electrical isolation of the electrical conductors in a subsequent processing step, whereby the presence of the removable appendage is indicative that the electrical conductors are not electrically isolated, or that the insert molded component has not been tested or inspected subsequent to electrical isolation of the electrical conductors, and whereby the removable appendage is configured to prevent use of the article manufactured to the intermediate degree in the end use assembly.

33 Claims, 2 Drawing Sheets

METHOD AND APPARATUS FOR INDICATING DEGREE OF MANUFACTURE OF AN ARTICLE

FIELD OF THE INVENTION

The present invention relates generally to articles and the manufacture thereof, and more particularly to methods and apparatus for indicating the degree of manufacture of articles, and still more particularly for preventing the use of an incompletely manufactured article in an end use assembly.

BACKGROUND OF THE INVENTION

The efficacy of quality control is well known and accepted generally by most if not all manufacturing industries. As the manufacture of articles becomes increasingly complex, quality control is used increasingly to ensure the integrity of the article at various stages of the manufacturing process. This is especially the case where the article is manufactured in multiple process steps or where the article is a component for use in an end use assembly, which is often performed by another manufacturer. Quality control thus includes inspection and testing of the articles, or components, at various stages of manufacture and prior to shipment to other manufacturers for inclusion in end use assemblies. The article is also likely to be subject to inspection or testing in its ultimate end use assembly.

Insert molded components are exemplary of articles manufactured in multiple manufacturing steps for use in an end use assembly. These components are formed by positioning an insert member in a mold cavity prior to injecting a molten material therein so as to form a molded housing member that at least partially captures the insert member so as to form the insert molded component. In electrical applications, the insert member is commonly a lead frame comprised of one or more electrical conductors coupled separately by one or more tie members. In one step of the manufacturing process, at least a portion of the lead frame is embedded in the molded housing member during the molding process so as to form a partially manufactured insert molded component. The electrical conductors are ultimately isolated electrically by severing the tie members of the lead frame. The tie members are severed prior to injection of the molten material in the mold cavity, or alternatively the tie members are severed in a subsequent punching, or stamping, operation which effectively removes the tie member. In other electrical applications, electrical components including conductors and passive and active circuit components are assembled with an electrical insert member of the insert molded component in a manufacturing step after the molding step.

The failure of an insert molded component, or other article, in an end use assembly frequently results in damage to the end use assembly, which may be considerably more costly than the mere cost of the failed article. It is thus generally necessary to inspect or test the article at critical phases of the manufacturing process. Insert molded electrical components, for example, are often inspected or tested so as to ensure that the electrical conductors of the lead frame are electrically isolated, or to verify proper assembly and operation of electrical circuits associated therewith. These articles are thus handled frequently, usually in batches, and are moved from station to station during the manufacturing process for molding, stamping, testing and inspection and other similar steps. The same is true of many other manufactured articles.

Heretofore it has been difficult to ascertain the degree of manufacture of an article as it progresses along the manufacturing process since it is very often not possible to visually detect whether a particular manufacturing operation has been performed. This is particularly so of more discrete operations including stamping operations performed on insert molded electrical components, which do not result in a readily observable change, as well as electrical circuit testing, which does not result in any observable change in the article. In some cases, for example, an insert molded electrical component may inadvertently skip over the stamping process or the testing process or some other critical manufacturing step, unbeknownst to manufacturing, personnel. The result is that the insert molded component, or other article, proceeds to a subsequent manufacturing step or is shipped in an incomplete state of manufacture. In other cases, the articles may be subject unnecessarily to one or more processing steps redundantly to ensure complete manufacture thereof resulting in production inefficiencies.

The inventors of the present invention recognize that it is desirable to provide means for identifying whether an article has been subjected to a particular stage of the manufacturing process. That is, to identify the degree to which the article has been manufactured successfully. The inventors recognize, however, that mere labeling or marking of an article is not always effective or sufficient for this purpose. The inventors of the present invention recognize further that it is desirable, and in many applications necessary, to provide means for preventing an intermediately manufactured article from proceeding to a subsequent manufacturing step or from being used in an end use assembly until all required prior manufacturing steps are completed by providing an appendage that physically prevents the intermediately manufactured article from combining, assembling, cooperating, or any physical interaction, with the end use assembly.

The known prior art does not address the foregoing problems, and for these reasons as well as other considerations there exists a demonstrated need for an advancement in the art of indicating a degree of manufacture of an article.

It is therefore an object of the invention to provide a novel method and apparatus for indicating a degree of manufacture of an article that overcomes the deficiencies of the prior art.

It is also an object of the invention to provide a novel method and apparatus for indicating a degree of manufacture of an article useable in an end use assembly by forming at least one removable appendage protruding from an article manufactured to an intermediate degree, the removable appendage providing a visual and tactile indication associated with the degree of manufacture of the article, the removable appendage alternatively including a visually perceptible notice located thereon, and the removable appendage configured to prevent use of the article manufactured to the intermediate degree in an end use assembly.

It is another object of the invention to provide a novel method and apparatus for indicating a degree of manufacture of an article useable in an end use assembly, wherein the article manufactured to an intermediate degree includes at least one removable appendage protruding from the article, the removable appendage configured to alter a profile of the article thereby preventing physical interaction of the article manufactured to the intermediate degree with an end use assembly, which includes further manufacturing, processing, inspection, and testing steps as well as the ultimate article use.

It is a further object of the invention to provide a novel method and apparatus for indicating a degree of manufacture of an article useable in an end use assembly by removing a removable appendage protruding from the article upon completion of an intermediate or final manufacture step, whereby existence of the removable appendage is indicative that said step has not been performed and the absence of the removable appendage is indicative that said step has been completed.

It is a more specific object of the invention to provide a novel method and apparatus for indicating a degree of manufacture of an insert molded component by forming a removable appendage protruding from the insert molded component manufactured to an intermediate degree, the insert molded component having a molded housing member capturing an insert member, the removable appendage protruding from at least one of the molded housing member and the insert member.

It is yet another object of the invention to provide a novel method and apparatus for indicating a degree of manufacture of an insert molded component useable in an end use assembly by forming a removable appendage protruding from the insert molded component manufactured to an intermediate degree, the insert molded component having a lead frame at least partially embedded in a molded housing member, and the removable appendage coupled to at least one or both of the lead frame and the molded housing member, the lead frame having at least two electrical conductors coupled separably by a tie member, the removable appendage removable upon or after electrical isolation of the electrical conductors in a subsequent processing step, whereby the presence of the removable appendage is indicative that the electrical conductors are not electrically isolated, or that the insert molded component has not been tested or inspected subsequent to electrical isolation of the electrical conductors.

BRIEF DESCRIPTION OF THE DRAWINGS

These and other objects, features and advantages of the present invention will become more fully apparent upon consideration of the following Detailed Description of the Invention with the accompanying Drawings, which may be disproportionate for ease of understanding, wherein like structure and steps are referenced by corresponding numerals and indicators throughout the several views, and wherein.

DETAILED DESCRIPTION OF THE INVENTION

Figure 1:
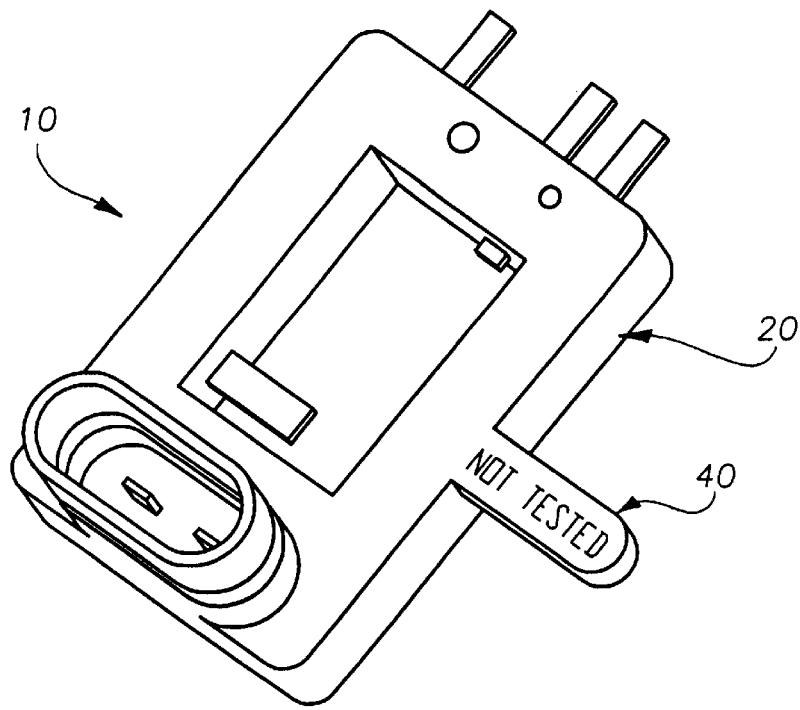
FIG. 1 is a perspective view of an article according to an exemplary embodiment of the invention.
Figure 2:
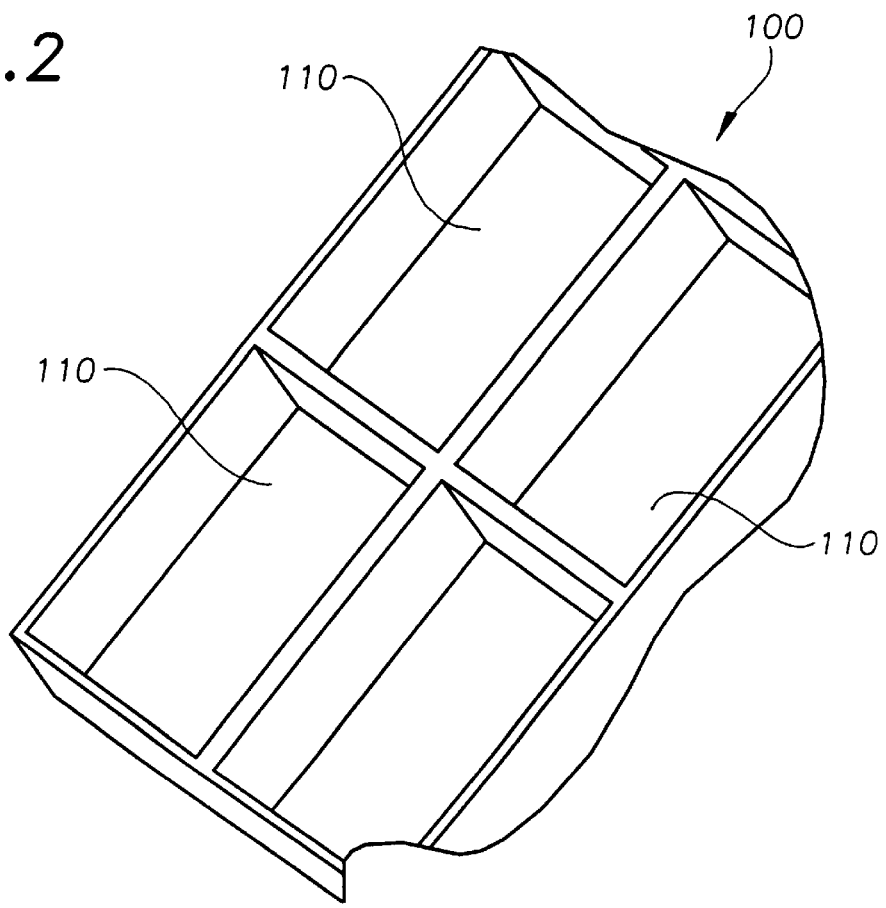
FIG. 2 is a perspective view of an article shipping container for receiving articles as shown in FIG. 1 according to an exemplary embodiment of the invention.

FIG. 1 is a perspective view of an insert molded electrical component 10 according to an exemplary embodiment of the invention, but may more generally be any article manufacturable according to the methods of the invention discussed herein. FIG. 2 is a similar perspective view an article shipping container 100 with a plurality of article receptacles 110 for receiving a corresponding article 10 according to an exemplary embodiment of the invention. But FIG. 2 is schematically representative more generally of an end use assembly for which the article 10 is useable in combination. The term end use assembly as used herein thus includes packages and containers in which the article 10 is disposed for shipping and handling, processing tools with which the article 10 is combined for the purpose of performing intermediate manufacturing steps, and sub-assemblies and assemblies with which the article 10 is combined during its manufacture for its ultimate use.

The invention is drawn generally to a method of manufacturing articles useable in an end use assembly and of indicating a degree of manufacture of the article. According to one aspect of the invention, an article manufactured to a first degree includes at least one removable appendage protruding from the article, wherein the removable appendage is configured to prevent use of the article manufactured to the first degree in an end use assembly. In a more specific embodiment, the removable appendage is configured to affect a profile of the article to the extent that the article can not be used, or interact physically, in or with the end use assembly, thereby preventing the article to proceed along the manufacturing process in an incomplete state of manufacture.

The article is subsequently manufactured to a second degree, which is more completely manufactured than the article manufactured to the first degree. According to this aspect of the invention, the degree to which the article is manufactured is relative, and an increasing degree of manufacture corresponds to increasing completeness of manufacture. The appendage is removable from the article manufactured to the second degree whereby the existence of the removable appendage is indicative that the article has not been manufactured to the second degree, and the absence of the removable appendage is indicative that the article has been manufactured to the second degree. The appendage however is more than a mere visual indicator since it prevents the article from being used, or interacting physically, in or with the end use assembly.

Figure 3:
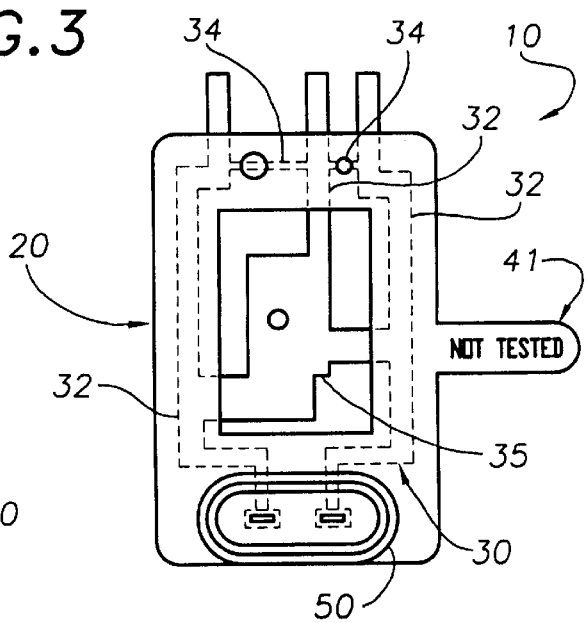
FIG. 3 is a top plan view of a partially manufactured article of FIG. 1 further illustrating, in phantom, a partially embedded insert member.
Figure 4:
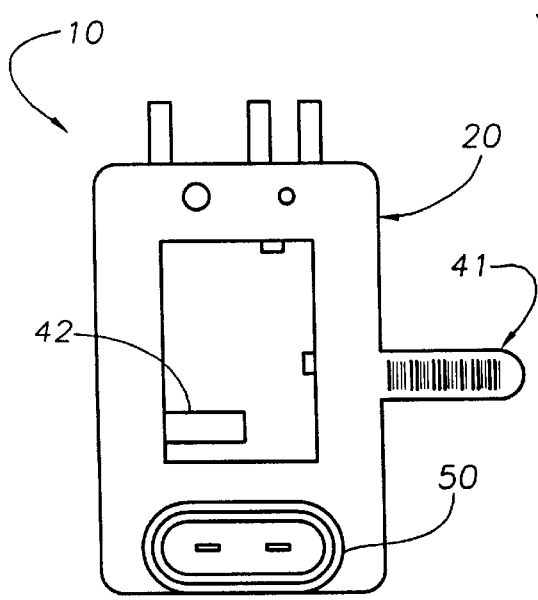
FIG. 4 is a top plan view of the article of FIG. 3 wherein the article has been further manufactured by electrically isolating the electrical conductors of the insert member.
Figure 5:
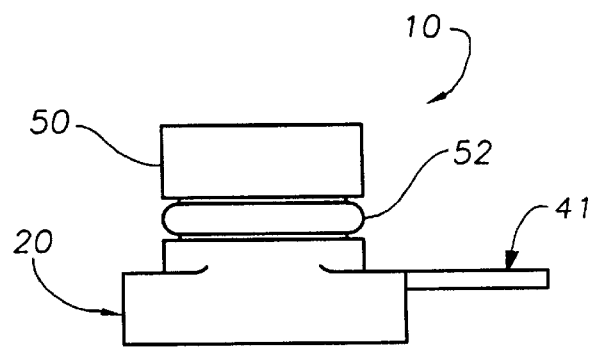
FIG. 5 is a side elevational view along lines I—I of FIG. 4.

According to a more specific mode of practicing the invention shown in FIGS. 1–3, the article 10 is an insert molded component having a molded housing member 20 and a lead frame 30 at least partially embedded in the molded housing member 20. The lead frame 30 includes at least two electrical conductors 32 coupled separably by at least one tie member 34. At least one removable appendage 41 or 42 is formed protruding from at least one of the molded housing member 20 and the lead frame 30. That is, the removable appendage is formed on either or both the molded housing member 20 and the lead frame 30. FIGS. 3 and 4 show a tie member 35 having a portion which is formable subsequently into an appendage 41 on the lead frame upon or after electrical isolation of the electrical conductors 32 as shown in FIG. 4. The lead frame 30 may more generally be any electrical component, including electrical circuit configurations having passive and active components, or alternatively a non-electrical insert member at least partially embedded in the molded housing member 20. According to these alternative aspects of the invention, the removable appendage is formed protruding from either the molded housing member or the electrical component or insert member.

Figure 6:
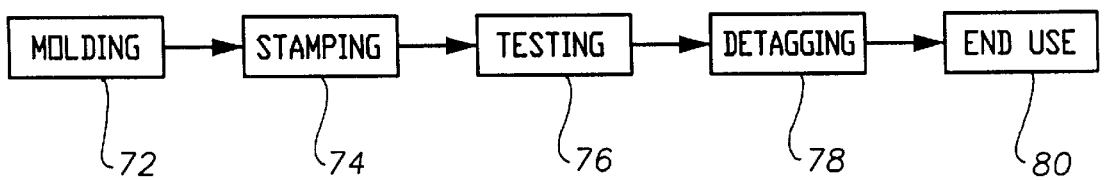
FIG. 6 is a schematic manufacturing flow diagram according to an exemplary mode of practicing the invention.

According to one mode of practicing the exemplary embodiments of the invention shown in FIGS. 1–3, the removable appendage 41, 42 is formable on the molded housing member 20 or on the lead frame 30 during the molding of the molded housing member 20 at which time the lead frame 30 is embedded therein. More specifically, the appendage 41 may be formed on the molded housing member during molding thereof, or alternatively the appendage 42 may be formed on the lead frame during a severing operation performed on the lead frame prior to injection of molten material into the mold cavity. According to the schematic manfuacturing flow diagram of FIG. 6, these steps occur at the molding step 72, which corresponds to manufacture of the insert molded electrical component, or article, 10 to a first degree.

The removable appendage 41 on the molded housing member 20 may be removed during, or simultaneously with, the stamping operation 74 thereby indicating completion of the stamping operation 74, which corresponds to a second degree of manufacturing. Alternatively, the appendage 41 on the molded housing member may be removed at a de-tagging step 78 upon successful completion of an inspection or testing step 76 as shown schematically in the flow chart of FIG. 6, which corresponds to the second degree of manufacturing. The removable appendage 41 on the molded housing member 20 may, for example, prevent insertion or disposal of the article 10 in a receptacle 110 of the shipping package 100, or prevent use of the article 10 in some other end use assembly shown schematically as step 80 of FIG. 6.

In an alternative mode of practicing the invention, a removable appendage 42 is formed on a portion of the lead frame 30 as shown in FIG. 4 during the severing of the tie members in the stamping operation 74, which occurs after the molding operation. The appendage 41 on the molded housing member 40 may be removed during the stamping operation 74 to indicate completion thereof. According to this aspect of the invention, the stamping operation 74 is a first degree of manufacture relative to the formation of the appendage 42 on the lead frame, and is a second degree of manufacture relative to removal of the appendage 41 from the molded insert housing member 20. The appendage 42 on the portion of the lead frame 30 may be subsequently removed at the de-tagging step upon successful completion of testing or inspection at step 76. In this application, the presence of the appendage 41 on the molded housing member 20 may prevent combining the insert molded component 10 with testing or inspection equipment thereby indicating that the stamping step 74 has not been performed. And the presence of the appendage 42 on the lead frame may prevent use of the insert molded component 10 in the end use assembly at step 80 thereby indicating that the testing or inspection step 76 has not been performed.

Alternatively, additional removable appendages, not shown, may be formed on the article 10 and remain thereon for use by other vendors at later phases of manufacturing. For example, a removable appendage may prevent coupling of the connector portion 50 of the article 10 with an end use assembly unless or until some earlier manufacturing step is performed, like installation of sealing member 52. According to this further example, the removable appendage is removable during or after installation of the sealing member, or possibly upon inspection thereof.

According to another aspect of the invention shown in FIGS. 1–3, the removable appendage 40 includes a visually perceptible notice indicating the degree of manufacture of the article, or for indicating that the article is not suitable for a particular end use assembly. Such a notice may be a human readable symbol or sign, like "NOT TESTED" as shown in FIGS. 2–3, or alternatively may be a machine interpretable bar code or other indicia as shown in FIG. 4. The removable appendage thus provides a visual and tactile indication of the degree of manufacture of the article, and may provide manufacturing inventory information. Additionally, the removable appendage prevents use of the article in an end use assembly as discussed above.

While the foregoing written description of the invention enables anyone skilled in the art to make and use what is at present considered to be the best mode of the invention, it will be appreciated and understood by anyone skilled in the art the existence of variations, combinations, modifications and equivalents within the spirit and scope of the specific exemplary embodiments disclosed herein. The present invention therefore is to be limited not by the specific exemplary embodiments disclosed herein but by all embodiments within the scope of the appended claims.

What is claimed is:

1. A method of indicating the degree of manufacture of a single article entity which is useable in an end use assembly, comprising the steps of:

manufacturing said single article entity to a first degree wherein said single article entity, manufactured to said first degree, includes at least one removable appendage formed during said manufacture of said single article entity to said first degree so as to be integral with said single article entity and protruding outwardly from said single article entity manufactured to said first degree, for the purpose of indicating to manufacturing personnel that said single article entity manufactured to said first degree is not as yet completely manufactured, to be accomplished within a subsequent manufacturing step, for use within an end use assembly, and for physically preventing interactive use of said single article entity, manufactured to said first degree, in an end use assembly unless said at least one removable appendage is removed from said single article entity before use of said single article entity in the end use assembly; and manufacturing said single article entity to a second degree by means of said subsequent manufacturing step, wherein said single article entity now manufactured to said second degree by means of said subsequent manufacturing step is more completely manufactured than said single article entity manufactured to said first degree, by necessarily removing said at least one removable appendage from said single article entity, manufactured to said first degree, so as to permit use of said single article entity, now manufactured to said second degree, within an end use assembly.

2. The method of claim 1, wherein said article comprises an insert molded component and the method further comprises the additional steps of:

at least partially embedding said insert member within a molded housing member; and forming said at least one removable appendage such that said at least one removable appendage protrudes from at least one of said molded housing member and said insert member.

3. The method of claim 2, further comprising the steps of:

providing said insert member as a lead frames, having at least two electrical conductors separably coupled together by at least one tie member, within said molded housing member; and separating said at least two electrical conductors of said lead frame so as to manufacture said insert molded component to said second degree.

4. The method of claim 3, further comprising the step of:
removing said removable appendage substantially upon separating said at least two electrical conductors at least partially embedded within said molded housing member.

5. The method of claim 3, further comprising the step of:
removing said removable appendage after verifying separation of said at least two electrical conductors of said lead frame.

6. The method of claim 1, further comprising the step of:
indicating the degree of manufacture of said article with a visually perceptible notice of written indicia located upon said removable appendage.

7. An article of manufacture useable in an end use assembly, comprising:
a single article entity manufactured to a first degree, wherein said single article entity, manufactured to said first degree, comprises perimeter structure and at least one removable appendage which is integral with said single article entity so as to form with said single article entity a one-piece manufactured item, said at least one removable appendage comprising a tab-shaped member protruding laterally outwardly from a side of said perimeter structure of said single article entity, manufactured to said first degree, for the purpose of indicating to manufacturing personnel that said single article entity manufactured to said first degree is not as yet completely manufactured, to be accomplished within a subsequent manufacturing step, for use within an end use assembly, and for physically preventing interactive use of said single article entity, manufactured to said first degree, within an end use assembly unless said at least one removable appendage is necessarily removed from said single article entity, by means of said subsequent manufacturing step which manufactures said single article entity to a second degree so as to render said single article entity more complete than said single article entity manufactured to said first degree, prior to use of said single article entity within an end use assembly,
whereby the existence of said at least one removable appendage upon said single article entity is indicative of the fact that said article has not been manufactured to said second degree and prevents said single article entity, manufactured to said first degree, from being used within an end use assembly.

8. The article as set forth in claim 7, wherein:
said article comprises an insert molded component having a molded housing member and an insert member at least partially embedded within said molded housing member; and
said at least one removable appendage protrudes from one of said molded housing and insert members.

9. The article as set forth in claim 8, wherein:
said insert member comprises an electrical component; and
said at least one removable appendage protrudes from one of said molded housing member and said electrical component.

10. The article as set forth in claim 9, wherein:
said electrical component comprises a lead frame having at least two electrical conductors separably coupled together by a tie member.

11. The method as set forth in claim 6, wherein:
said written indicia comprises a human-readable notice comprising written words.

12. The method as set forth in claim 6, wherein:
said written indicia comprises a machine-readable notice comprising a bar-code.

13. The method as set forth in claim 2, wherein:
said at least one removable appendage is formed upon said molded housing member.

14. A method of indicating the degree of manufacture of a single article entity which is useable in an end use assembly, comprising the steps of:
manufacturing said single article entity to a first degree wherein said single article entity, manufactured to said first degree, includes at least one removable appendage formed during said manufacture of said single article entity to said first degree so as to be integral with said single article entity and protruding outwardly from said single article entity, manufactured to said first degree, for the purpose of indicating to manufacturing personnel that said single article entity manufactured to said first degree is not as yet completely manufactured, as will be accomplished within a subsequent manufacturing step, and for physically preventing interactive use of said single article entity, manufactured to said first degree, within said subsequent manufacturing step for manufacturing said single article entity, manufactured to said first degree, to a second degree, wherein said single article entity manufactured to said second degree is more completely manufactured than said single article entity manufactured to said first degree, unless said at least one removable appendage is necessarily removed before completion of said manufacture of said article to said second degree; and
manufacturing said single article entity to said second degree by necessarily removing said at least one removable appendage from said single article entity, manufactured to the first degree, prior to completion of said manufacture of said single article entity to said second degree so as to permit said single article entity, manufactured to said first degree, to be further manufactured to said second degree.

15. The method as set forth in claim 14, wherein said article comprises an insert molded component and the method further comprises the additional steps of:
at least partially embedding said insert member within a molded housing member; and
forming said at least one removable appendage such that said at least one removable appendage protrudes from at least one of said molded housing and insert members.

16. The method as set forth in claim 15, further comprising the steps of:
providing said insert member as a lead frame, having at least two electrical conductors separably coupled together by at least one tie member, within said molded housing member; and
separating said at least two electrical conductors of said lead frame so as to manufacture said insert molded component to said second degree.

17. The method as set forth in claim 16, further comprising the step of:
removing said removable appendage substantially upon separating said at least two electrical conductors at least partially embedded within said molded housing member.

18. The method as set forth in claim 16, further comprising the step of:
removing said removable appendage after verifying separation of said at least two electrical conductors of said lead frame.

19. The method as set forth in claim 14, further comprising the step of:

indicating the degree of manufacture of said article with a visually perceptible notice of written indicia located upon said removable appendage.

20. The method as set forth in claim 19, wherein:

said written indicia comprises a human-readable notice comprising written words.

21. The method as set forth in claim 19, wherein:

said written indicia comprises a machine-readable notice comprising a bar-code.

22. The method as set forth in claim 15, wherein:

said at least one removable appendage is formed upon said molded housing member.

23. The article as set forth in claim 7, wherein:

said removable appendage comprises a visually perceptible notice of written indicia.

24. The article as set forth in claim 23, wherein:

said written indicia comprises a human-readable notice comprising written words.

25. The article as set forth in claim 23, wherein:

said written indicia comprises a machine-readable notice comprising a bar code.

26. The article as set forth in claim 8, wherein:

said at least one removable appendage is formed upon said molded housing member.

27. An article of manufacture useable in an end use assembly, comprising:

a single article entity manufactured to a first degree, wherein said single article entity, manufactured to said first degree, comprises perimeter structure and at least one removable appendage which is integral with said single article entity so as to form with said single article entity a one-piece manufactured item, said at least one removable appendage comprising a tab-shaped member protruding laterally outwardly from a side of said perimeter structure of said single article entity, manufactured to said first degree, for the purpose of indicating to manufacturing personnel that said single article entity manufactured to said first degree is not as yet completely manufactured, to be accomplished within a subsequent manufacturing step, for use within an end use assembly, and for physically preventing interactive use of said single article entity, manufactured to said first degree, within said subsequent manufacturing step, unless said at least one removable appendage is necessarily removed before completion of said subsequent manufacturing step for manufacturing said single article entity, manufactured to said first degree, to a second degree, wherein said single article entity manufactured to said second degree is more completely manufactured than said single article entity manufactured to said first degree, whereby the existence of said at least one removable appendage upon said single article entity is indicative of the fact that said single article entity has not been manufactured to said second degree and prevents said single article entity, manufactured to said first degree, from being manufactured further to said second degree.

28. The article as set forth in claim 27, wherein:

said article comprises an insert molded component having a molded housing member and an insert member at least partially embedded within said molded housing member; and said at least one removable appendage protrudes from one of said molded housing and insert members.

29. The article as set forth in claim 28, wherein:

said insert member comprises an electrical component; and said at least one removable appendage protrudes from one of said molded housing member and said electrical component.

30. The article as set forth in claim 29, wherein:

said electrical component comprises a lead frame having at least two electrical conductors separably coupled together by a tie member.

31. The article as set forth in claim 27, wherein:

said removable appendage comprises a visually perceptible notice of written indicia.

32. The article as set forth in claim 31, wherein:

said written indicia comprises a human-readable notice comprising written words.

33. The article as set forth in claim 31, wherein:

said written indicia comprises a machine-readable notice comprising a bar code.

* * * * *